United States Patent [19]
Laermer et al.

[11] Patent Number: 5,498,312
[45] Date of Patent: Mar. 12, 1996

[54] METHOD FOR ANISOTROPIC PLASMA ETCHING OF SUBSTRATES

[75] Inventors: Franz Laermer, Stuttgart; Andrea Schilp, Schwaebisch Gmuend, both of Germany

[73] Assignee: Robert Bosch GmbH, Stuttgart, Germany

[21] Appl. No.: 243,783

[22] Filed: May 17, 1994

[30] Foreign Application Priority Data

May 27, 1993 [DE] Germany .................. 43 17 623.2

[51] Int. Cl.$^6$ .................. H01L 21/00; H05H 1/00
[52] U.S. Cl. .................. 156/643.1; 156/646.1; 156/662.1; 216/69; 216/67
[58] Field of Search .................. 156/643.1, 646.1, 156/662.1, 345; 216/69, 67

[56] References Cited

U.S. PATENT DOCUMENTS

| | | | |
|---|---|---|---|
| 4,784,720 | 11/1988 | Douglas | 156/643 |
| 4,844,767 | 7/1989 | Okudaira et al. | 156/345 |
| 4,985,109 | 1/1991 | Otsubo et al. | 156/345 |
| 4,992,136 | 2/1991 | Tachi et al. | 156/643 |
| 5,013,401 | 5/1991 | Samukawa et al. | 156/643 |
| 5,061,838 | 10/1991 | Lane et al. | 156/345 X |
| 5,078,833 | 1/1992 | Kadomura | 156/643 |
| 5,143,866 | 9/1992 | Matsutani | 156/643 X |
| 5,211,790 | 5/1993 | Tatsumi | 156/662 |
| 5,242,561 | 9/1993 | Sato | 156/345 X |
| 5,296,095 | 3/1994 | Nabeshima et al. | 156/662 |
| 5,326,431 | 7/1994 | Kadomura | 156/643 X |

*Primary Examiner*—Thi Dang
*Attorney, Agent, or Firm*—Spencer & Frank

[57] ABSTRACT

A method for anisotropic plasma etching of silicon substrates, a plasma etching apparatus for implementing the method, and an electronic device manufactured according to the method, which method includes the steps of positioning a substrate having a surface to be depleted by etching within a processing chamber and in communication with an electrode; introducing a gas mixture including an etching gas and a passivating gas which are essentially free of chlorine, bromine or iodine into the processing chamber, the etching gas including at least one halogen or halogen compound and the passivating gas including at least one polymer-generating monomer; exciting the gas mixture with electromagnetic radiation effective to produce a plasma containing ions; and applying a voltage to one of the substrate or the electrode to accelerate the ions toward the substrate and provide the ions with an energy ranging from about 1 to about 40 eV, preferably from about 10 to about 30 eV, when the ions impinge on the surface of the substrate.

10 Claims, 1 Drawing Sheet

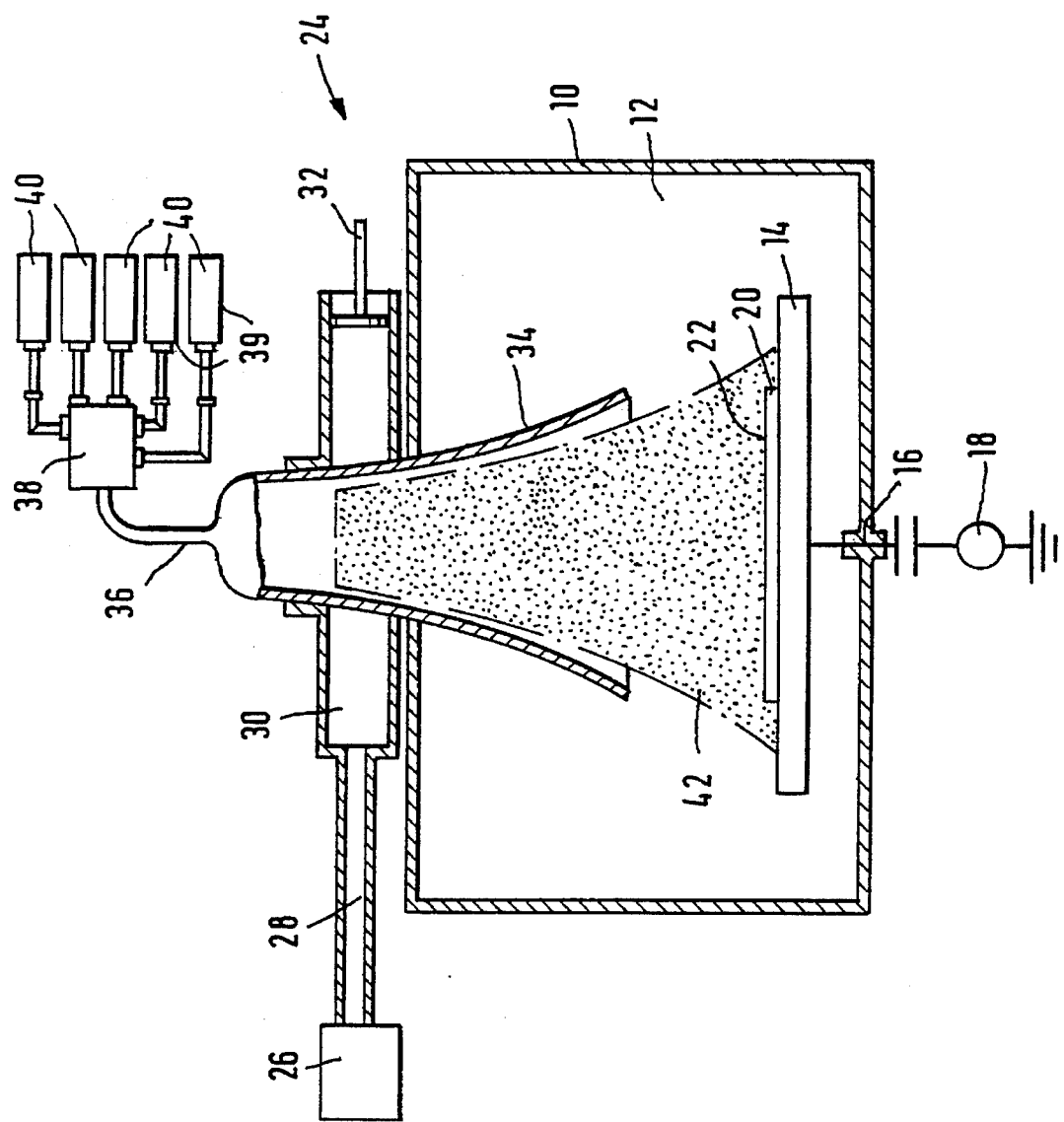

METHOD FOR ANISOTROPIC PLASMA ETCHING OF SUBSTRATES

CROSS REFERENCE TO RELATED APPLICATION

This application claims the priority of application Ser. No. P 43 17 623.2 filed May 27, 1993 in Germany, the subject matter of which is incorporated herein by reference.

BACKGROUND OF THE INVENTION

1. Field of the Invention

This invention relates to a method for anisotropic plasma etching of substrates and to an apparatus for implementing the method, as well as to electronic devices manufactured in accordance with the method.

2. Background of the Related Art

Methods for anisotropic plasma etching, particularly for anisotropic plasma etching of silicon, distinguish themselves in that the structures to be produced can be worked into the substrate practically independently of the crystal orientation of the substrate. Preferred fields of application are micromachining and sensor technology, where structures having a high aspect ratio, i.e., a high structural height-to-width ratio, or having narrow grooves and vertical walls are to be produced, for example, for oscillating structures, capacitive or resonant sensors, electrostatic actuators, etc. Further fields of application include microelectronics, where so-called trenched grooves are required for component insulation or collector contact, and storage cells in general. Due to the production of narrow grooves by anisotropic plasma etching, a significant amount of chip area can be saved.

The RIE (reactive ion etching) processes which are commonly used for anisotropic silicon plasma etching employ the less reactive halogens chlorine or bromine, which are used either directly or are released from corresponding compounds, for example, $CF_3BR$, $CCl_4$, $CF_2Cl_2$, or $CF_3Cl$, in the plasma, as well as relatively high energy ions, for example, 100 eV and higher. The resulting ion bombardment onto the etching ground, i.e., the area to be etched, initiates the reaction of adsorbed halogen radicals with the silicon to be depleted, while the spontaneous reaction on the side walls of the etched structures, which are not exposed to any direct influence by ions, is minor with these less reactive halogens chlorine and bromine.

However, there are a multitude of problems connected with processes employing chlorine and/or bromine from the equipment and process technology points of view because these gases are extremely corrosive and are often poisonous and/or carcinogenic. Furthermore, they tend to produce a so-called undesirable "black silicon" on the etched area and exhibit low mask selectivity, i.e., masking material and substrate exhibit comparable etching rates. Moreover, these FCKW (fluorinated and chlorinated hydrocarbons) and/or FBrKW (fluorinated and brominated hydrocarbons) substances will not be available in the near future.

Processes employing a fluorine-based chemical, which partially overcomes these disadvantages, produce significantly greater silicon conversion rates and are substantially less critical with respect to process and equipment technology. However, fluorine-based chemicals exhibit an inherent isotropic etching characteristic, which means that the spontaneous etching reaction of fluorine radicals in relation to silicon is so strong that the side walls of etched structures are also significantly attacked and significant undercutting occurs. Due to the difficulty of controlling plasma chemistry, attempts to date have failed to produce, in a controlled manner, both F-radicals which affect etching and radicals of polymer-forming monomers, and to simultaneously maintain them for a sufficiently long time period in the plasma to allow polymer formation and coating of the side walls to protect the side walls of the etched structures from attack by etching while the area to be etched is attacked by the etching species. The coexistence of fluorine radicals and unsaturated monomers is nearly impossible to attain at low excitation densities. Moreover, the etching rates that can be attained in this manner are very low, so that the problem of mask material depletion which is too pronounced in relation to the silicon conversion rate, also remains unsolved.

It is therefore the object of the present invention to provide an anisotropic plasma etching method which overcomes the above disadvantages of prior art methods, an apparatus for implementing the method, and electronic devices which are advantageously provided with etched structures having a high aspect ratio and one of narrow or deep trenches.

SUMMARY OF THE INVENTION

The object of the present invention is accomplished by providing a method for anisotropic plasma etching of substrates including silicon substrates, comprising the steps of (a) positioning a substrate having a surface to be depleted by etching within a processing chamber and in communication with an electrode; (b) introducing a gas mixture comprised of an etching gas and a passivating gas into the processing chamber, the etching gas comprising at least one halogen or halogen compound, and the passivating gas comprising at least one polymer-generating monomer; (c) exciting the gas mixture with electromagnetic radiation, preferably microwave energy, effective to produce a plasma containing ions; and (d) applying a voltage to one of the substrate or the electrode to accelerate the ions toward the substrate and provide the ions with an energy ranging from about 1 to about 40 eV when the ions impinge on the surface of the substrate. Preferably the ions have an energy ranging from about 10 to about 30 eV when the ions impinge on the surface of the substrate.

Preferably the etching gas is selected from the group consisting of $SF_6$, $CF_4$, $NF_3$ and mixtures thereof. The etching gas is preferably introduced into the processing chamber at a flow velocity ranging between about 10 and about 200 sccm.

Preferably the passivating gas is selected from the group consisting of $CHF_3$, $C_2F_4$, $C_2F_6$, $C_2H_2F_2$, $C_4F_8$ and mixture thereto The passivating gas is preferably introduced into the processing chamber at a flow velocity ranging between about 50 and about 300 sccm.

The gas mixture may advantageously include argon introduced into the processing chamber at a flow velocity ranging between about 10 and about 100 sccm. The gas mixture may advantageously include at least one of $N_2$, introduced into the processing chamber at a flow velocity ranging between about 10 and about 100 sccm, or $O_2$ introduced into the processing chamber at a flow velocity ranging between about 1 and about 10 sccm.

The substrate may advantageously be cooled to a temperature below about 100° C.

The object of the present invention is additionally accomplished by providing a plasma etching apparatus for implementing the above method, comprising an enclosure within which is defined a processing chamber and which includes at least one electrode, a gas inlet for introducing a gas mixture into the processing chamber, and means for exciting the gas mixture by electromagnetic energy, preferably microwave energy.

The object of the present invention is further accomplished by providing an electronic device selected from the group consisting of an electronic component and a sensor element which has etched structures having a high aspect ratio and one of narrow or deep trenches, wherein the etched structures are produced by the above method.

The method according to the invention solves the aforementioned problems of the prior art and relates to the production of a plasma having a suitable chemical composition, preferably having a pure chemical fluorine base with a high density of reactive particles and low energy ions, by means of intensive energy irradiation with electromagnetic radiation, such as microwave energy. The method according to the invention does not employ chlorine or bromine and this results in significant cost savings for otherwise necessary safety devices and exhaust gas cleaning, and in decreased wear of the equipment which are traditionally encountered when chlorine or bromine materials are employed.

According to the present invention, only minor acceleration of the generated ions toward the substrate results in a high mask selectivity, i.e., the masked substrate is etched at a rate which is well in excess of the etching rate of the masking material so that $SiO_2$ and even photoresist masking material are depleted only slightly if at all. High etching rates for Si on the order of a few micrometers/minute and nearly perfect anisotropy of the etching process without undercutting of the mask are obtained.

This is possible because a gas mixture is employed which includes a fluorine-producing etching gas, such as $SF_6$, $CF_4$ or $NF_3$, and a passivating gas which produces polymer-forming monomers which are essentially free of chlorine or bromine, such as $CHF_3$, $C_2F_6$, $C_2H_2F_2$, $C_4F_2$ or $C_2F_4$, is used. Due to intensive plasma excitation, preferably induced by microwave irradiation, a large number of free radicals of fluorine and of teflon-producing monomers, $\cdot CF_2 \cdot$, are generated in the plasma. The high intensity of excitation permits the actual coexistence in the plasma of these totally contrasting compounds over a sufficiently long period of time to build a polymer coating and provide protection for the side walls.

Due to the exclusive influence of very low energy ions on the area being etched, the latter remains substantially free of any polymer coating by the $CF_2$-monomers and may be etched unhampered by the free radicals of fluorine, while the side walls of the etched structure are coated with a teflon-like film $-(CF_2)_n$ and are thus protected from etching. In order to keep the area to be etched free of any polymer coating, ion energies ranging between 1 and 40 eV, preferably ranging between 10 and 30 eV, are sufficient, which makes it possible to keep the depletion of the masking material, for example, $SiO_2$ or photoresist, very low.

Since the masking material may be a photoresist, there are significant cost advantages in production of etched substrates according to the method of the present invention. The use of photoresist masks is significantly less expensive than the use of hard-substance masks, which are otherwise necessary, and allows greater process flexibility. Moreover, many structures are only realizable with such flexible masking conditions.

Good thermal coupling of the substrate to be etched to the substrate electrode is essential for protection of the side walls during etching by means of the deposited polymer coating and for high mask selectivity in order to prevent overheating of the substrate surface facing the plasma. If the temperature of the substrate increases to values in excess of 100°C., the depletion of the photoresist masking material increases gradually and the chemical stability of the polymer coating deposited on the side walls decreases slowly. Thermal coupling between the substrate and substrate electrode may be obtained, for example, by means of a helium convection stream between the rear side of the substrate and the electrode surface or by means of an elastomer arranged between them. The distance between the substrate and the electrode is generally approximately 0.1 mm.

The method according to the invention can be advantageously implemented in any plasma arrangement which is provided with at least one electrode, one gas inlet for introducing a gas mixture, and means for exciting the gas mixture by electromagnetic energy. The energy may be supplied in the form of high-frequency alternating voltage in a triode arrangement, an inductively coupled plasma (ICP) or, particularly advantageously, by means of radiating microwaves into an ECR (electron cyclotron resonance) or PIE (propagation ion etching) arrangement. As a result, electronic components may be produced, which are provided with etched structures having a high aspect ratio and extremely deep grooves.

BRIEF DESCRIPTION OF THE DRAWING

The sole figure shows a plasma etching apparatus which includes microwave excitation. The apparatus is described in the following in which further advantages of the inventive method are additionally described.

DESCRIPTION OF THE PREFERRED EMBODIMENTS

A typical plasma etching apparatus includes an enclosure or vessel 10 which defines an evacuatable processing chamber 12. In chamber 12, a planar electrode 14 is arranged which is connected by means of a vacuum passage 16 to a high-frequency generator 18. A substrate 20 whose surface 22 is to be treated is situated on the electrode 14 in thermal and electrical contact therewith.

Above substrate 20, an arrangement 24 is positioned which is provided with a microwave generator 26, which microwave generator 26 is connected via a wave guide 28 to a resonator 30. From the resonator 30, which is provided with an adjustment slider 32, microwaves may be coupled into a dome-shaped emitter 34, a so-called surfatron 34, which is aimed at the substrate 20 and from which microwaves are guided to the substrate surface 22. A plasma 42 may be ignited by any well known means, such as by means of a separate ignition device (not shown) positioned above the substrate surface 22 and in the surfatron 34.

Surfatron 34 is provided with a flow of a gas mixture via a gas inlet 36 which is connected to a mixing plenum 38 to which gas vessels 39 containing different gases 40 are connected. Gases 40, which may have different flow volumes, are mixed in mixing plenum 38 and are supplied to the processing chamber 12 via this assembly.

In order to prevent excessive substrate temperatures, an elastomer (not shown) may be positioned between the substrate 20 and the planar electrode 14, thereby improving the transport of heat away from substrate 20 to electrode 14. As an alternative, electrode 14 may be provided with a holder (not shown), which biases substrate 20 at a defined distance of approximately 0.1 mm toward the electrode against a sealing device. Due to the resulting gap, a helium convection stream is directed, for example, through bores defined in planar electrode 14, for the purpose of cooling the wafer backside. The sealing device seals the vacuum with respect to the helium stream.

The method according to the invention is basically suitable for all plasma arrangements in which a high-density plasma (approximately $10^{12}$ ions/cm$^3$) is produced by intense high-frequency or microwave excitation. Due to high-frequency power from high frequency generator 18 which is additionally coupled into substrate 20, the low-energy ions generated, for example, by means of high-frequency or microwave excitation are accelerated to a desired energy level within the plasma and toward substrate 20. In this manner, the ion energy may be set independently of the plasma density. As a result, other plasma-producing arrangements are also conceivable, for example, plasmas by apparatus including a triode arrangement, plasmas by magnetron excitation, or plasmas by ECR or ICP excitation.

Suitable process parameters, with which the described plasma etching apparatus may be operated include a process pressure ranging between about 1 and about 100 μbar, an SF$_6$ flow ranging between about 10 and about 200 sccm (standard cc/min) and an CHF$_3$ or C$_4$F$_8$ flow ranging between about 50 and about 300 sccm. To improve the stability of the process, an argon flow ranging between about 10 and about 100 sccm may also be added. The roughness of the area being etched and the side walls may be advantageously influenced by minor admixtures to the gas mixture of N$_2$, preferably between about 10 and about 100 sccm, and/or of O$_2$, preferably ranging between about 1 and about 10 sccm, with the gases being advantageously admixed right from the start. In case of microwave excitation, the coupled-in microwaves should range between about 300 and about 1200 watt. At a high-frequency power ranging between about 1 and about 20 watts at the substrate electrode, ion-acceleration voltages ranging between about 1 and about 50 volts, depending on the process pressure, respectively, may be set. The ion energies may range between about 1 and about 40 eV, and preferably range between about 10 and about 30 eV. If the selected ion energies are too high, the so-called mask selectivity deteriorates and the mask provided on the substrate surface 22 is also significantly etched away.

The etching rates which are typically attainable in a substrate composed of silicon range between about 1 to about 5 μm per minute, while selectivity for the substrate material in relation to the photoresist mask material ranges, for example, between about 30:1 and about 100:1. Due to the method according to the invention, etching profiles that are practically vertical, with no mask undercut, are obtained with the etching trenches tending to become slightly narrower with increasing depth. Profiles of this type are ideal for re-coating. Since the roughness of the edges and of the etched area is very minor, structures which are produced by the inventive method may even be used for the purpose of shaping, for example, an original form for injection molding or for galvanic shaping techniques.

It will be understood that the above description of the present invention is susceptible to various modifications, changes and adaptations, and the same are intended to be comprehended within the meaning and range of equivalents of the appended claims.

What is claimed is:

1. A method for anisotropic plasma etching of silicon substrates, comprising the steps of:
   a. positioning a substrate having a surface to be depleted by etching within a processing chamber and in communication with an electrode;
   b. introducing a gas mixture comprised of an etching gas and a passivating gas into the processing chamber, which gas mixture is essentially free of chlorine, bromine and iodine, which etching gas comprises at least one fluorine or fluorine compound, and which passivating gas comprises at least one polymer-generating monomer;
   c. exciting the gas mixture with electromagnetic radiation effective to produce a plasma containing ions and having a plasma density of at least $10^{12}$ ions/cm$^3$; and
   d. applying a voltage to one of the substrate or the electrode to accelerate the ions toward the substrate and provide the ions with an energy ranging from about 1 to about 40 eV when the ions impinge on the surface of the substrate.

2. The method according to claim 1, wherein the ions have an energy ranging from about 10 to about 30 eV when the ions impinge on the surface of the substrate.

3. The method according to claim 1, wherein the etching gas is selected from the group consisting of SF$_6$, CF$_4$, NF$_3$ and mixtures thereof.

4. The method according to claim 3, wherein the etching gas is introduced into the processing chamber at a flow velocity ranging between about 10 and about 200 sccm.

5. The method according to claim 1, wherein the passivating gas is selected from the group consisting of CHF$_3$, C$_2$F$_4$, C$_2$F$_6$, C$_2$H$_2$F$_2$, C$_4$F$_8$ and mixtures thereof.

6. The method according to claim 5, wherein the passivating gas is introduced into the processing chamber at a flow velocity ranging between about 50 and about 300 sccm.

7. The method according to claim 1, wherein the electromagnetic radiation is microwave energy.

8. The method according to claim 1, wherein the gas mixture includes argon introduced into the processing chamber at a flow velocity ranging between about 10 and about 100 seem.

9. The method according to claim 1, wherein the gas mixture includes at least one of N$_2$, introduced into the processing chamber at a flow velocity ranging between about 10 and about 100 sccm, or O$_2$ introduced into the processing chamber at a flow velocity ranging between about 1 and about 10 sccm.

10. The method according to claim 1, further comprising cooling the substrate to a temperature below 100° C.

\* \* \* \* \*